(12) United States Patent
Washizu

(10) Patent No.: US 8,605,825 B2
(45) Date of Patent: *Dec. 10, 2013

(54) RECEIVING APPARATUS, TEST APPARATUS, RECEIVING METHOD AND TEST METHOD

(75) Inventor: Nobuei Washizu, Saitama (JP)

(73) Assignee: Advantest Corporation, Tokyo (JP)

( * ) Notice: Subject to any disclaimer, the term of this patent is extended or adjusted under 35 U.S.C. 154(b) by 78 days.

This patent is subject to a terminal disclaimer.

(21) Appl. No.: 13/192,402

(22) Filed: Jul. 27, 2011

(65) Prior Publication Data

US 2012/0194251 A1    Aug. 2, 2012

Related U.S. Application Data

(63) Continuation of application No. PCT/JP2009/002053, filed on May 11, 2009.

(51) Int. Cl.
*H03K 9/00* (2006.01)
*H04L 27/00* (2006.01)

(52) U.S. Cl.
USPC ........... 375/316; 375/326; 375/354; 375/371; 375/226; 327/276; 327/277; 327/149; 324/76.11

(58) Field of Classification Search
USPC .......... 375/316, 326, 354, 371, 226; 327/276, 327/277, 149; 324/76.11; 365/233
See application file for complete search history.

(56) References Cited

U.S. PATENT DOCUMENTS

| 7,002,334 B2* | 2/2006 | Tanaka et al. | 324/76.11 |
| 7,333,570 B2* | 2/2008 | Aung et al. | 375/326 |
| 2004/0208048 A1* | 10/2004 | Doi et al. | 365/145 |
| 2004/0251914 A1* | 12/2004 | Doi et al. | 324/537 |
| 2005/0219937 A1* | 10/2005 | Sato | 365/233 |
| 2007/0126487 A1* | 6/2007 | Sartschev et al. | 327/276 |
| 2009/0048796 A1* | 2/2009 | Yamamoto et al. | 702/69 |

FOREIGN PATENT DOCUMENTS

| JP | 2003-315428 A | 11/2003 |
| JP | 2004-127455 A | 4/2004 |

* cited by examiner

*Primary Examiner* — Sam K Ahn
*Assistant Examiner* — Fabricio R Murillo Garcia

(57) ABSTRACT

Provided is a receiving apparatus that receives a data signal and a clock signal indicating a reference timing to acquire the data signal. The receiving apparatus includes a multi-strobe generating section that generates, based on a pulse of the recovered clock, a plurality of strobes of which phases are different from each other, a first detecting section that detects a position of an edge of the clock signal relative to the strobes based on values of the clock signal that are acquired at respective timings of the strobe, a first adjusting section that adjusts a phase of the recovered clock according to the edge position of the clock signal, and a second adjusting section that adjusts the timing to acquire the data signal according to a phase adjustment amount of the recovered clock made by the first adjusting section.

14 Claims, 6 Drawing Sheets

RECEIVING APPARATUS, TEST APPARATUS, RECEIVING METHOD AND TEST METHOD

BACKGROUND

1. Technical Field

The present invention relates to a receiving apparatus, a test apparatus, a receiving method and a test method.

2. Related Art

A device (DDR-SDRAM or the like) that sends a data signal and a clock signal has been known. A test apparatus testing such device uses a multi-strobe function to test a phase relationship between a data signal and a clock signal.

When a device that outputs a data signal and a clock signal concurrently is tested, a test apparatus needs to be adjusted such that it generates multi-strobes at appropriate timings. However, even after the adjustment is made, if a phase of the clock signal is shifted by jitter, wander, drift or the like, a phase relationship between a data signal and a clock signal is not retained and therefore it is not possible to perform testing accurately.

Prior Art Document

Patent Document 1: Japanese patent application publication 2003-315428
Patent Document 2: Japanese patent application publication 2004-127455

SUMMARY

Therefore, it is an object of an aspect of the innovations herein to provide a receiving apparatus, a test apparatus, a receiving method and a test method, which are capable of overcoming the above drawbacks accompanying the related art. The receiving apparatus that receives a data signal and a clock signal indicating a reference timing to acquire the data signal, and includes a first recovered clock generating section that generates a first recovered clock of the clock signal, a first multi-strobe generating section that generates, in response to a pulse of the first recovered clock, a plurality of first strobes of which phases are different from each other, a first detecting section that detects a position of an edge of the clock signal relative to the first strobes based on values of the clock signal that are acquired at respective timings of the first strobe, a first adjusting section that adjusts a phase of the first recovered clock according to the edge position of the clock signal, and a second adjusting section that adjusts the timing to acquire the data signal according to a phase adjustment amount of the first recovered clock made by the first adjusting section.

The summary clause does not necessarily describe all necessary features of the embodiments of the present invention. The present invention may also be a sub-combination of the features described above.

DESCRIPTION OF EXEMPLARY EMBODIMENTS

Hereinafter, embodiment of the present invention will be described. The embodiment does not limit the invention according to the claims, and all the combinations of the features described in the embodiments are not necessarily essential to means provided by aspects of the invention.

Figure 1:
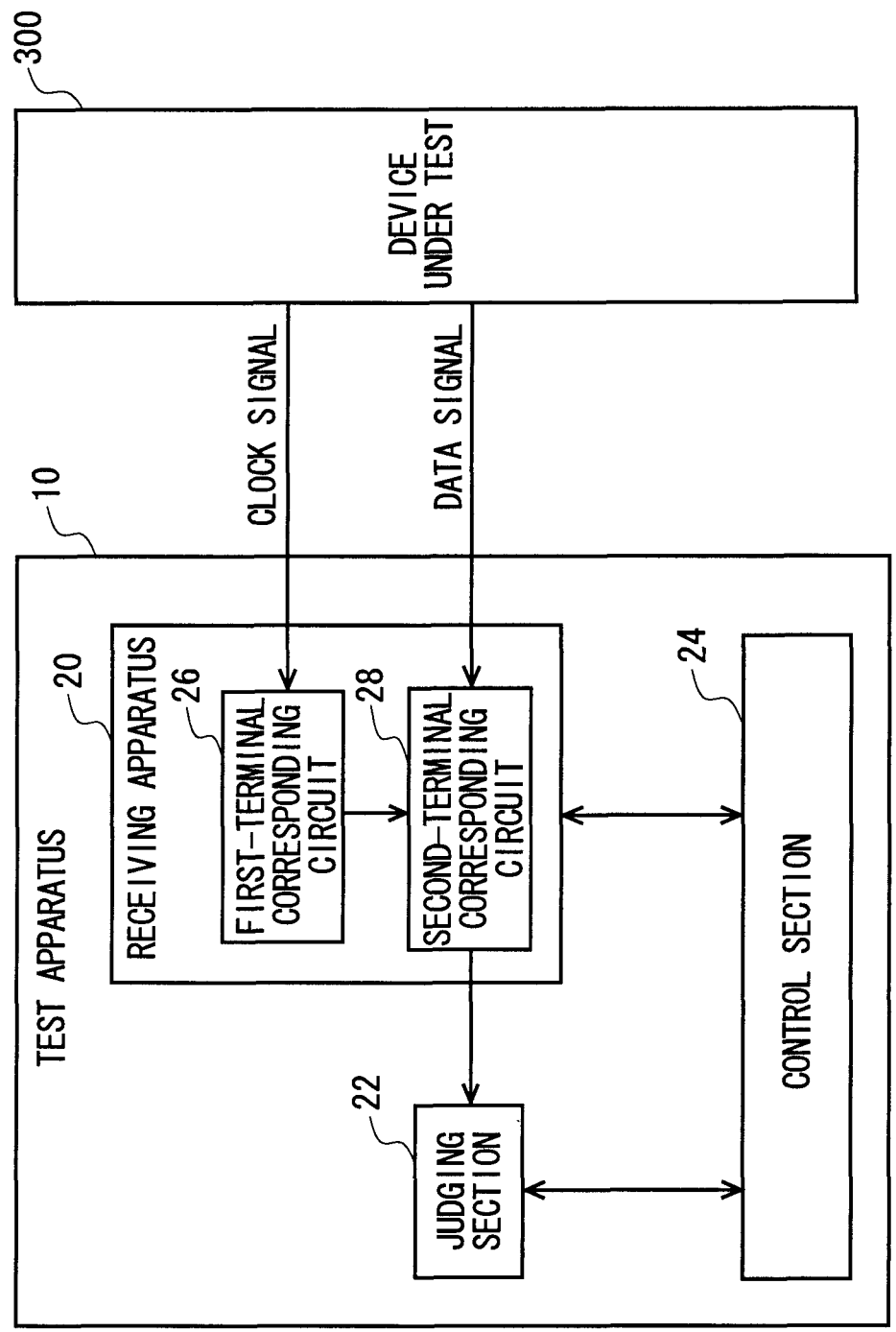
FIG. 1 illustrates a configuration of a test apparatus 10 according to an embodiment together with a device under test 300.

FIG. 1 illustrates a configuration of a test apparatus 10 according to an embodiment together with a device under test 300. The test apparatus 10 tests the device under test 300. The device under test 300 outputs a data signal and a clock signal that indicates a reference timing to acquire the data signal. The device under test 300 is, for example, a device such as Double-Data Rate Synchronous Dynamic Random Access Memory (DDR-SDRAM).

The device under test 300 may send a clock-embedded signal. In this case, the test apparatus 10 divides a single clock-embedded signal into two signals. The test apparatus 10 receives one of the divided signals as a data signal and the other of the divided signals as a clock signal. Alternatively, the device under test 300 may sends separate two clock-embedded signals. In this case, the test apparatus 10 receives one of the two clock-embedded signals as a data signal and the other of the two clock-embedded signals as a clock signal.

The test apparatus 10 includes a receiving apparatus 20, a judging section 22 and a control section 24. The receiving apparatus 20 receives a data signal and a clock signal output by the device under test 300.

The receiving apparatus 20 includes a first-terminal corresponding circuit 26 and a second-terminal corresponding circuit 28. The first-terminal corresponding circuit 26 is provided corresponding to an output terminal for the clock signal output by the device under test 300. The first-terminal corresponding circuit 26 recovers an edge of the clock signal received from the device under test 300 to generate a first recovered clock.

The second-terminal corresponding circuit 28 is provided corresponding to an output terminal for the data signal output by the device under test 300. During a training period for generating a second recovered clock, the second-terminal corresponding circuit 28 recovers an edge of the data signal received from the device under test 300 to generate the second recovered clock.

Moreover, during a data transmission period after the training period, the second-terminal corresponding circuit 28 obtains the data signal based on the second recovered clock that is generated in the training period. The second-terminal corresponding circuit 28 further measures jitter in the data signal during the data transmission period. During the data transmission period, the second-terminal corresponding circuit 28 further corrects a phase of the second recovered clock according to a change in a phase of the first recovered clock recovered by the first-terminal corresponding circuit 26.

The judging section 22 judges pass or fail of the device under test 300 based on the result of the obtained data signal by the receiving apparatus 20. The control section 24 controls operations of the receiving apparatus 20 and the judging section 22.

The device under test 300 may output a plurality of data signals in addition to the clock signal. In this case, the receiving apparatus 20 includes a plurality of the second-terminal corresponding circuits 28 that respectively correspond to a plurality of the output terminals that output data signals.

Figure 2:
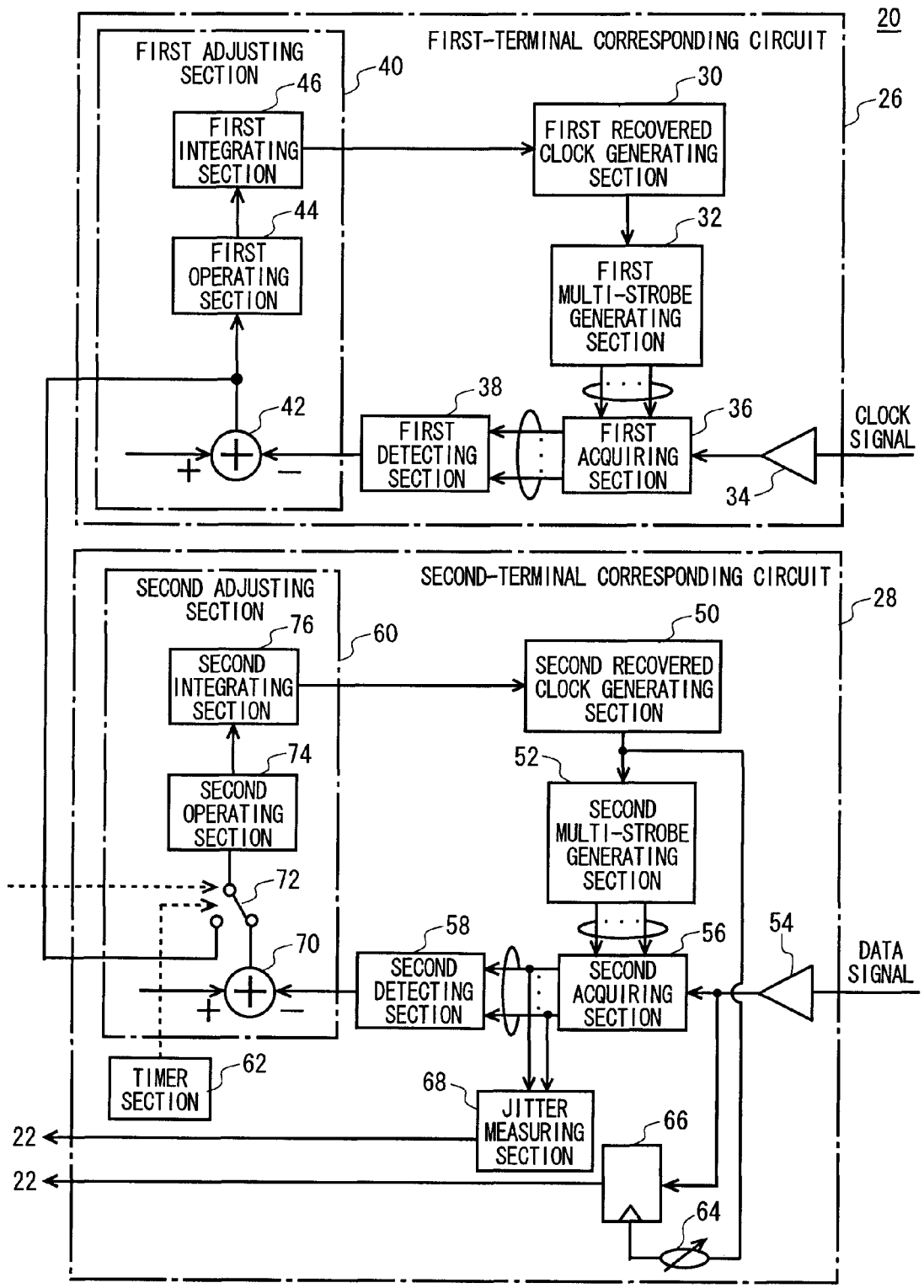
FIG. 2 illustrates a configuration a first-terminal corresponding circuit 26 and a second-terminal corresponding circuit 28 provided in a receiving apparatus 20 according to the embodiment.

FIG. 2 illustrates a configuration the first-terminal corresponding circuit 26 and the second-terminal corresponding circuit 28 provided in the receiving apparatus 20 according to the embodiment. The first-terminal corresponding circuit 26 includes a first recovered clock generating section 30, a first multi-strobe generating section 32, a first receiving section 34, a first acquiring section 36, a first detecting section 38 and a first adjusting section 40.

The first recovered clock generating section 30 generates a first recovered clock of the clock signal. The first recovered clock generating section 30 changes a phase of the first recovered clock according to a control amount provided by the first adjusting section 40.

The first multi-strobe generating section 32 generates, in response to a pulse of the first recovered clock, first strobes of which phases are different from each other. The first multi-strobe generating section 32 generates, for example, first strobes that are delayed by prescribed intervals from a reference phase of the first recovered clock.

The first receiving section 34 compares the level of the clock signal received from the outside with the level of the threshold value, and then outputs a clock signal that represents a logical value. The first acquiring section 36 acquires values of the clock signal output by the first receiving section 34 at respective timings of the first strobes generated by first multi-strobe generating section 32.

The first detecting section 38 detects a position of an edge of the clock signal relative to the first strobes based on the values of the clock signal that are acquired at the respective timings of the first strobes by the first acquiring section 36. In other words, the first detecting section 38 determines at which strobe from among the first strobes the edge position of the clock signal is detected, values of the clock signal are arranged in time-line, and the edge position can be determined from a changing point in the values of the clock signal. The first detecting section 38 then outputs, to the first adjusting section 40, the position of the strobe at which the edge position of the clock signal is detected.

The first adjusting section 40 adjusts the phase of the first recovered clock according to the edge position of the clock signal. More specifically, the first adjusting section 40 adjusts the phase of the first recovered clock by providing a control amount to first recovered clock generating section 30, such that the position of a first boundary strobe matches the edge position of the clock signal. The first boundary strobe is predetermined and selected from among the first strobes.

The position of the first boundary strobe may be a position of one of the first strobes, or a position between any two adjacent strobes among the first strobes. The position of the first boundary strobe may be changeable, for example, from the outside.

The first adjusting section 40 includes, for example, a first difference calculating section 42, a first operating section 44, a first integrating section 46. The first difference calculating section 42 detects first difference data that indicates a difference between the position of the first boundary strode and the position of the strobe at which the edge position of the clock signal is detected. The first difference calculating section 42 also detects a first E/L code which represents an earlier-or-later relationship between the edge position of the clock signal and the position of the first boundary strobe.

When the first boundary strobe is positioned earlier than the edge position of the clock signal, the first difference calculating section 42 outputs the first E/L code that represents EARLY. While the first boundary strobe is positioned later than the edge position of the clock signal, the first difference calculating section 42 outputs the first E/L code that represents LATE.

The first operating section 44 generates, at each cycle, a control amount for adjusting the phase of the first recovered clock based on the first difference data and the first E/L code that are detected by the first difference calculating section 42. The first integrating section 46 performs integration of the control amount and supplies the resulting control amount to the first recovered clock generating section 30. The first integrating section 46 may filters the control amount output at each cycle by using a low-pass filter, and may supply the resulting control amount to the first recovered clock generating section 30.

The first-terminal corresponding circuit 26 described above performs generation of the first strobes, detection of the edge position of the clock signal, and adjustment of the phase of the first recovered clock at each period of the first recovered clock or at each cycle which is a predetermined multiple of the period of the first recovered clock. In this way, the first-terminal corresponding circuit 26 can generate the first recovered clock that is synchronized with the phase of the clock signal at the edge position.

The second-terminal corresponding circuit 28 includes a second recovered clock generating section 50, a second multi-strobe generating section 52, a second receiving section 54, a second acquiring section 56, a second detecting section 58, a second adjusting section 60, a timer section 62, a delay section 64, a data acquiring section 66 and a jitter measuring section 68. The second recovered clock generating section 50 generates a second recovered clock of the clock signal. The second recovered clock generating section 50 changes a phase of the second recovered clock according to a control amount provided by the second adjusting section 60.

The second multi-strobe generating section 52 generates, in response to a pulse of the second recovered clock, second strobes having different phases. The second multi-strobe generating section 52 generates, for example, second strobes which are delayed by prescribed intervals from a reference phase of the second recovered clock.

The second receiving section 54 compares the level of the data signal received from the outside with the level of a threshold value, and then outputs a data signal that represents a logical value. The second acquiring section 56 acquires values of the data signal output by the second receiving section 54 at respective timings of the second strobes generated by second multi-strobe generating section 52.

The second detecting section 58 detects a position of an edge of the data signal relative to the second strobes based on the values of the data signals that are acquired at the respective timings of the second strobes by the second acquiring section 56. In other words, the second detecting section 58 determines at which strobe from among the second strobes the edge position of the data signal is detected, values of the data signals are arranged in time-line, and the edge position can be determined from a changing point in the values of the data signal. The second detecting section 58 then outputs, to the second adjusting section 60, the position of the strobe at which the edge position of the data signal is detected.

The second adjusting section 60 adjusts the phase of the second recovered clock by providing a control amount to the second recovered clock generating section 50. During a training period for the second recovered clock, the second adjusting section 60 adjusts the phase of the second recovered clock according to the edge position of the data signal. More specifically, during the training period, the second adjusting section 60 performs the adjustment such that the position of a second boundary strobe matches the edge position of the data signal. The second boundary strobe is predetermined and selected from among the second strobes.

The position of the second boundary strobe may be a position of one of the second strobes, or a position between any two adjacent strobes among the second strobes. The position of the second boundary strobe may be changeable, for example, from the outside.

During a data transmission period after the training period, the second adjusting section 60 adjusts the phase of the second recovered clock according to the amount of adjustment made to the phase of the first recovered clock by the first adjusting section 40. During the data transmission period, the second adjusting section 60 adjusts, for example, the phase of the second recovered clock by the same amount as the adjustment amount of the phase of the first recovered clock adjusted by the first adjusting section 40. In this way, the second adjusting section 60 can adjust the timing at which the data signal is acquired depending on the adjustment amount of the phase of the first recovered clock adjusted by the first adjusting section 40.

The second adjusting section 60 includes, for example, a second difference calculating section 70, a switching section 72, a second adjusting section 74 and a second integrating section 76. The second difference calculating section 70 detects second difference data that represents a difference between the position of the second boundary strode and the position of the strobe at which the edge position of the data signal is detected. The second difference calculating section 70 also detects a second E/L code which represents an earlier-or-later relationship between the edge position of the data signal and the position of the second boundary strobe.

When the second boundary strobe is positioned earlier than the edge position of the data signal, the second difference calculating section 70 outputs the second E/L code that represents EARLY. While the second boundary strobe is positioned later than the edge position of the clock signal, the second difference calculating section 70 outputs the second E/L code that represents LATE.

The switching section 72 switches whether the phase of the second recovered clock is adjusted according to the edge position of the data signal or according to the amount of adjustment made to the phase of the first recovered clock by the first adjusting section 40. In other words, the switching section 72 switches whether the phase of the second recovered clock is adjusted according to the first difference data and the first E/L code or according to the second difference data and the second E/L code.

For example, the switching section 72 supplies the second difference data calculated by second difference calculating section 70 and the second E/L code to the second adjusting section 74 during the training period. The switching section 72 supplies, to the second adjusting section 74, the first difference data calculated by first difference calculating section 42 in the first adjusting section 40 and the first E/L code during the data transmission period.

The second adjusting section 74 generates, at each cycle, a control amount for adjusting the phase of the second recovered clock based on the first difference data and the first E/L code or the second difference data and the second E/L code that are provided by the switching section 72. The second integrating section 76 performs integration of the control amount and supplies the resulting control amount to the second recovered clock generating section 50. The second integrating section 76 may filters the control amount output at each cycle by using a low-pass filter, and may supply the resulting control amount to the second recovered clock generating section 50.

The timer section 62 gives an instruction to the switching section 72 to adjust the phase of the second recovered clock according to the second difference data and the second E/L code during a prescribed training period. The timer section 62 further gives an instruction to the switching section 72 to adjust the phase of the second recovered clock according to the first difference data and the first E/L code after the training period is ended.

The delay section 64 delays the second recovered clock output by the second recovered clock generating section 50 by a prescribed amount of delay. The delay section 64 delays the second recovered clock by, for example, an amount of time which corresponds to a half of the period of the second recovered clock. In this way, the delay section 64 can generate the second recovered clock that exhibits a timing of a center phase of the data signal (the intermediate position between two adjacent edges of the data signal).

The data acquiring section 66 acquires a value of the data signal at the timing of the second recovered clock delayed by the delay section 64. The data acquiring section 66 then sends the acquired value to the judging section 22.

The jitter measuring section 68 receives the edge position of the data signal relative to the second strobes from the second detecting section 58 and measures jitter for the data signal. For instance, the jitter measuring section 68 obtains positions of the strobes which detected the edge positions of the data signal, and then detects a histogram of the strobe positions which detected the edge positions.

During the training period, the second-terminal corresponding circuit 28 described above performs generation of the second strobes, detection of the edge position of the data signal, and adjustment of the phase of the second recovered clock at each period of the second recovered clock or at each cycle which is a predetermined multiple of the period of the second recovered clock. In this way, the second-terminal corresponding circuit 28 can generate the second recovered clock that is synchronized with the phase of the data signal at the edge position.

Moreover, during the data transmission period after the training period, the second-terminal corresponding circuit 28 can adjust, based on the change in the phase of the clock signal, the phase of the second recovered clock that was recovered in the training period. In this way, during the data transmission period after the training period, the second-terminal corresponding circuit 28 can shift the timing to acquire a value of the data signal in accordance with a phase shift of the clock signal caused by, for example, jitter, wander, drift or the like.

Figure 3:
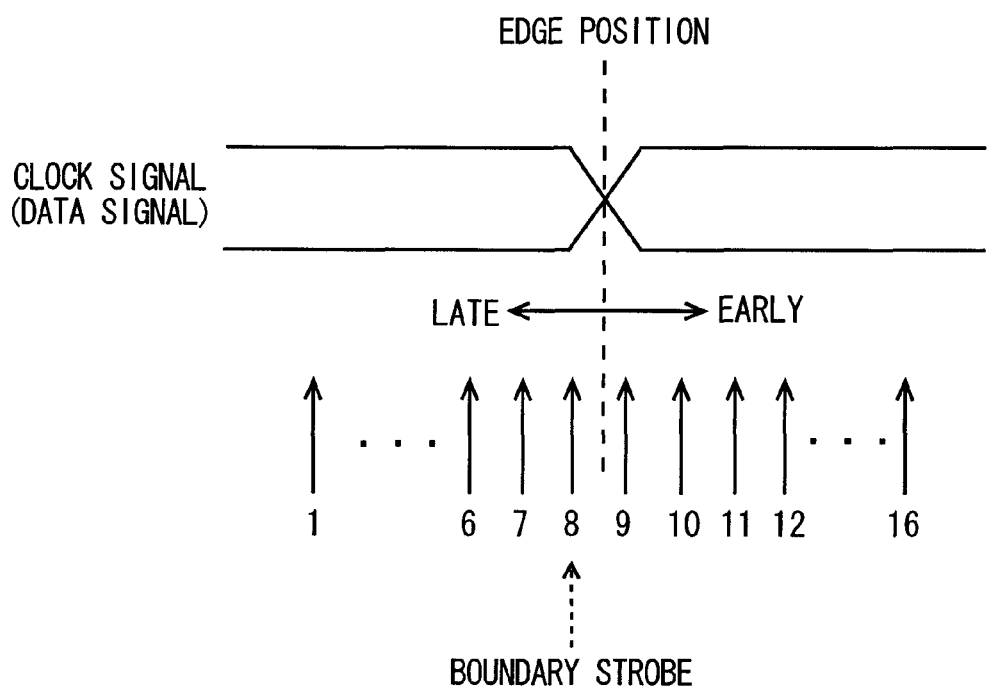
FIG. 3 illustrates an example of operations performed by a first adjusting section 40 and a second adjusting section 60 according to the embodiment.

FIG. 3 illustrates an example of operations by the first adjusting section 40 and the second adjusting section 60 according to the embodiment. The first adjusting section 40 shifts the phase of the first recovered clock according to the difference between the position of the strobe at which the edge position is detected and the position of the first boundary strobe. In this case, the first adjusting section 40 shifts the phase of the first recovered clock such that the position of the first boundary strobe is made closer to the edge position of the clock signal.

For example, when the position of the first boundary strobe is situated before the edge position of the clock signal (in other words, when the code indicating EARLY is detected), the first adjusting section 40 delays the phase of the first recovered clock by the time duration which corresponds to the difference between the position of the strobe that detects the edge position of the clock signal and the position of the first boundary strobe. On the contrary, when the position of the first boundary strobe is situated after the edge position of the clock signal (in other words, when the code indicating LATE is detected), the first adjusting section 40 advances the phase of the first recovered clock by the time duration which corresponds to the difference between the position of the strobe that detected the edge position of the clock signal and the position of the first boundary strobe.

By performing such process at each cycle, the first adjusting section 40 can adjust the phase of the first recovered clock such that the position of the first boundary strobe among the first strobes is moved close to the edge position of the clock signal. In this way, it is possible for the first adjusting section 40 to synchronize the position of the first boundary strobe with the edge position of the clock signal.

The second adjusting section 60 performs the same operation as the first adjusting section 40 on the second recovered clock. In this way, the second adjusting section 60 can adjust the phase of the second recovered clock such that the position of the second boundary strobe among the second strobes is moved close to the edge position of the data signal. Accordingly, it is possible for the second adjusting section 60 to synchronize the position of the second boundary strobe with the edge position of the data signal.

Figure 4:
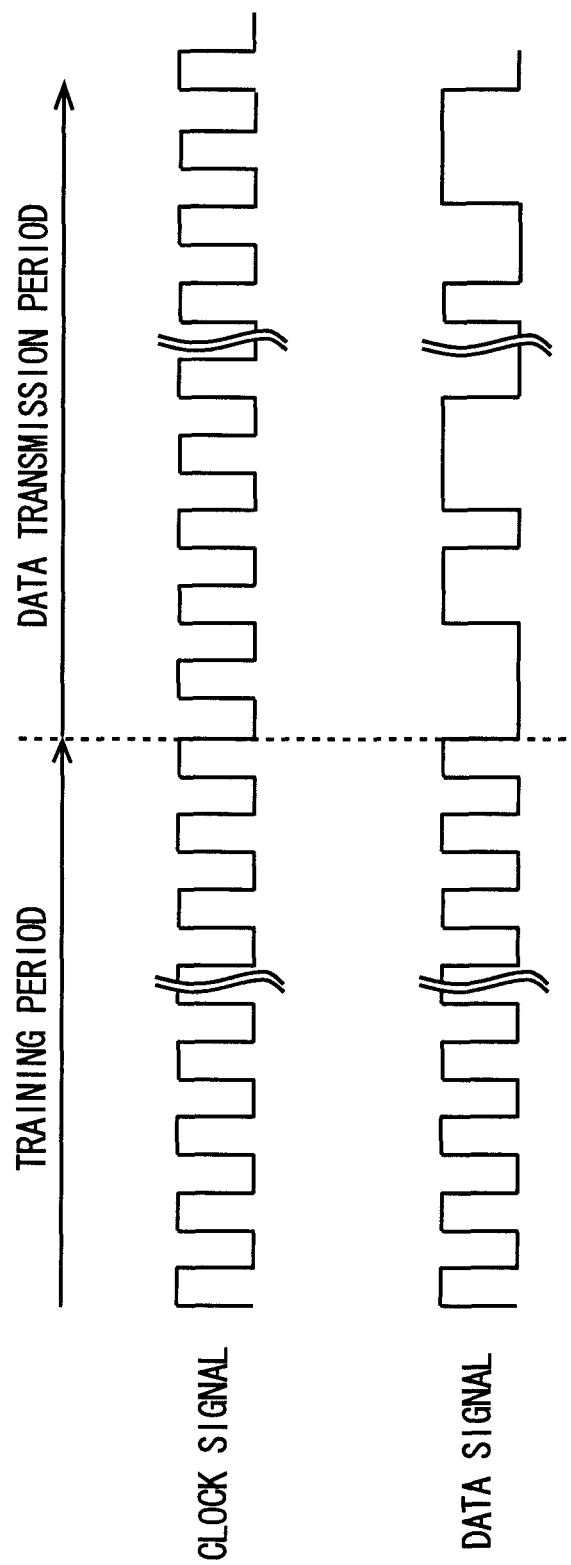
FIG. 4 illustrates an example of a clock signal and a data signal output by a device under test 300 according to the embodiment.

FIG. 4 illustrates an example of a clock signal and a data signal output by the device under test 300 according to the embodiment. During the training period for the data signal, the device under test 300 outputs a data signal that has a waveform identical to the clock signal or a wave form with which the clock can be recovered. In this way, the receiving apparatus 20 can recover the second recovered clock that indicates a timing to acquire the data signal by using only the data signal during the training period.

During the data transmission period after the training period ends, the device under test 300 outputs a data signal that includes a response signal that corresponds to the test signal supplied thereto. During the data transmission period, the receiving apparatus 20 acquires a value of the data signal at the timing of the second recovered clock that is recovered in the training period.

Figure 5:
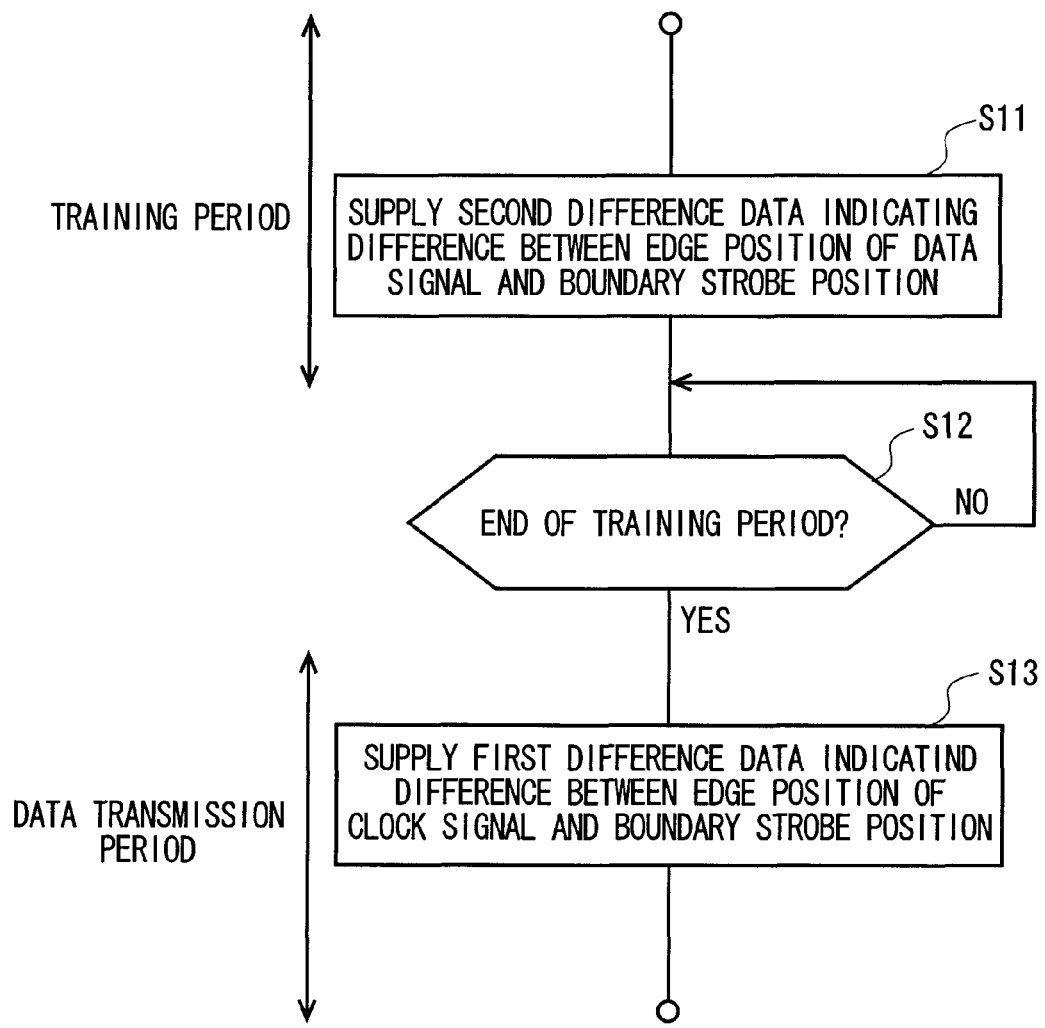
FIG. 5 shows a flow of operation performed by a switching section 72 according to the embodiment.

FIG. 5 shows a flow of operation performed by the switching section 72 according to the embodiment. The switching section 72 supplies, to the second adjusting section 74, second difference data that indicates a difference between the edge position of the data signal and the second boundary strobe, and a second E/L code which represents an earlier-or-later relationship between the edge position of the data signal and the position of the second boundary strobe (S11).

When the training period finishes (Yes in S12), the device under test 300 goes to the data transmission period. During the transmission period, the switching section 72 supplies, to the second adjusting section 74, the first difference data that indicates a difference between the edge position of the clock signal and the boundary strobe, and the first E/L code which represents an earlier-or-later relationship between the edge position of the clock signal and the position of the first boundary strobe (S13).

At this point, the switching section 72 switches whether the phase of the second recovered clock is adjusted according to the first difference data or the second difference data, for example, depending on an instruction from the timer section 62. More specifically, when a prescribed time duration has elapsed since the receiving apparatus 20 started receiving, the timer section 62 supplies an instruction to the switching section 72, and the instruction may be to switch the state from the state where the first difference data is supplied to the second adjusting section 74 to the state where the second difference data is supplied to the second adjusting section 74.

Alternatively, the switching section 72 may switch whether the phase of the second recovered clock is adjusted according to the first difference data or the second difference data, for example, depending on an instruction from the control section 24 that controls the operation of the receiving apparatus 20. More specifically, the control section 24 generates the instruction to cause the switching section 72 to switch at the timing of transition from the training period to the data transmission period.

With the above-described receiving apparatus 20, even if the phase of the clock signal is shifted by jitter, wander and drift or the like while the data signal is received, it is possible to adjust the phase of the second recovered clock that indicates the timing to acquire a value of the data signal in synchronization with the phase shift of the clock signal. Therefore, the receiving apparatus 20 can obtain values of the data signal accurately and can measure characteristics of the data signal while retaining the phase relationship between the clock signal and the data signal.

Figure 6:
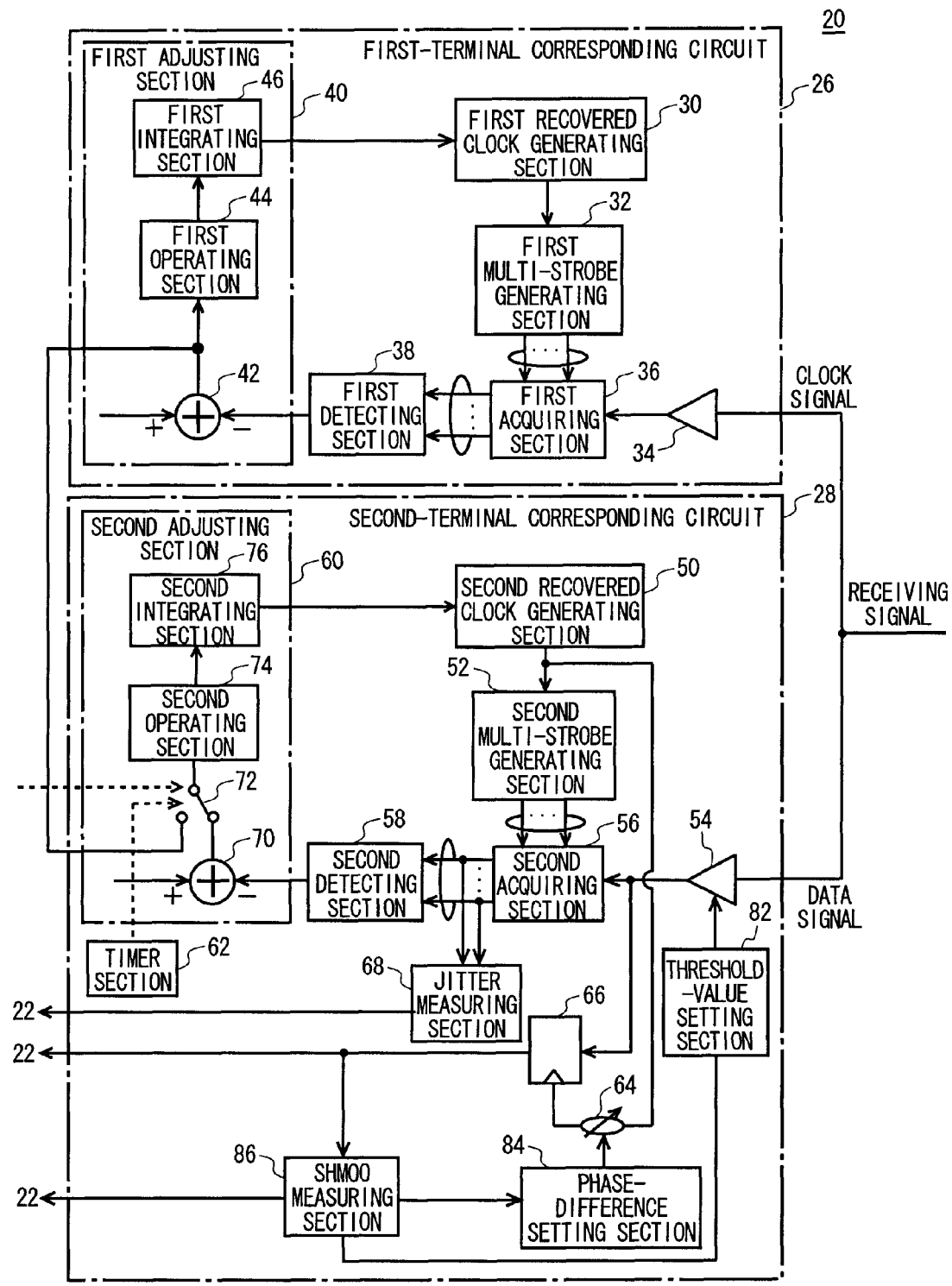
FIG. 6 illustrates a configuration of the receiving apparatus 20 according to a modification example of the embodiment.

FIG. 6 illustrates a configuration of the receiving apparatus 20 according to a modification example of the embodiment. Most of the structures and functions of the receiving apparatus 20 according to the modification example of the embodiment are same as those of the embodiment illustrated in FIG. 2, and therefore the identical reference numerals are given to the components having the same structure and function as the components of the receiving apparatus 20 in the embodiment illustrated in FIG. 2, and those explanation will be hereunder omitted.

The receiving apparatus 20 according to the modification example receives a receiving signal, which is, for example, a clock-embedded signal, from the outside the apparatus. The first receiving section 34 in the first-terminal corresponding circuit 26 receives the receiving signal supplied from the outside as the clock signal. The second receiving section 54 in the second-terminal corresponding circuit 28 receives the receiving signal supplied from the outside as the data signal.

The second-terminal corresponding circuit 28 of the receiving apparatus 20 further includes a threshold-value setting section 82, a phase-difference setting section 84 and a shmoo measuring section 86. The threshold-value setting section 82 sets a threshold value for the second receiving section 54 to judge a logical value of the receiving signal.

The phase-difference setting section 84 sets a phase difference for the second recovered clock relative to the first recovered clock. The phase-difference setting section 84 supplies, for example, to the second difference calculating section 70, a delay amount which corresponds to the set phase difference.

The shmoo measuring section 86 sets threshold values set by the threshold-value setting section 82 in the second receiving section 54. Moreover, the shmoo measuring section 86 sets a phase difference for the second recovered clock relative to the first recovered clock by using the phase-difference setting section 84 for each threshold value. The shmoo measuring section 86 then obtains logical values of the data signal (a shmoo waveform) when the threshold values and the phase differences are set.

The receiving apparatus 20 according to the modification example can measure a shmoo waveform of the received signal while performing the clock recovery for the receiving signal, which is, for example, a clock-embedded signal. Such receiving apparatus 20 can synchronize and adjust the phase of the received signal even if the phase of the clock signal is shifted during the measurement of the shmoo waveform. Therefore, it is possible to obtain an accurate shmoo waveform according to the receiving apparatus 20.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A receiving apparatus that receives a data signal and a clock signal indicating a reference timing to acquire the data signal, the receiving apparatus comprising:
    a first recovered clock generating section that generates a first recovered clock of the clock signal;
    a first multi-strobe generating section that generates, in response to a pulse of the first recovered clock, a plurality of first strobes having different phases;
    a first detecting section that detects a position of an edge of the clock signal relative to the first strobes, based on values of the clock signal that are acquired at respective timings of the first strobes;
    a first adjusting section that adjusts a phase of the first recovered clock by a phase adjustment amount, according to the position of the edge of the clock signal detected by the first detecting section;
    a second recovered clock generating section that generates a second recovered clock;
    a second multi-strobe generating section that generates, in response to a pulse of the second recovered clock, a plurality of second strobes having different phases;
    a second detecting section that detects a position of an edge of the data signal relative to the second strobes, based on values of the data signal that are acquired at respective timings of the second strobe; and
    a second adjusting section that adjusts a phase of the second recovered clock according to the phase adjustment amount of the first recovered clock by the first adjusting section.

2. The receiving apparatus according to claim 1, wherein, the second adjusting section adjusts the phase of the second recovered clock by the same amount as the phase adjustment amount of the first recovered clock by the first adjusting section.

3. The receiving apparatus according to claim 2, wherein, the second adjusting section adjusts the phase of the second recovered clock according to the position of the edge of the data signal during a training period for the second recovered clock, and
    after the training period for the second recovered clock ends, the second adjusting section adjusts the phase of the second recovered clock by the same amount as the phase adjustment amount of the first recovered clock by the first adjusting section.

4. The receiving apparatus according to claim 3, further comprising:
    a switching section that switches whether the phase of the second recovered clock is adjusted according to first difference data that indicates a difference between the position of the edge of the clock signal relative to the first strobes and a position of a first boundary strobe that is selected in advance from among the first strobes, or according to second difference data that indicates a difference between the position of the edge of the data signal relative to the second strobes and a position of a second boundary strobe that is selected in advance from among the second strobes.

5. The receiving apparatus according to claim 4, further comprising:
    a timer section that supplies, to the switching section, an instruction to adjust the phase of the second recovered clock according to the second difference data during the predetermined training period, and an instruction to adjust the phase of the second recovered clock according to the first difference data after the training period ends.

6. The receiving apparatus according to claim 4, wherein, the switching section switches, depending on an instruction from a controlling section that controls operation of the receiving apparatus, whether the phase of the second recovered clock is adjusted according to the first difference data or the second difference data.

7. The receiving apparatus according to claim 3, further comprising:
    a jitter measuring section that receives, from the second detecting section, the position of the edge of the data signal relative to the second strobes, and measures jitter for the data signal.

8. The receiving apparatus according to claim 1, further comprising: a first receiving section that receives a receiving signal supplied from the outside as the clock signal; and a second receiving section that receives the receiving signal supplied from the outside as the data signal.

9. The receiving apparatus according to claim 8, further comprising:
    a threshold-value setting section that sets a threshold value for the second receiving section to judge a logical value of the receiving signal.

10. The receiving apparatus according to claim 9, further comprising:
    a phase-difference setting section that sets a phase difference for the second recovered clock relative to the first recovered clock.

11. The receiving apparatus according to claim 10, further comprising:
    a shmoo measuring section that sets threshold values in the second receiving section by using the threshold-value setting section, sets a phase difference for the second recovered clock relative to the first recovered clock by using the phase difference setting section for each threshold value, and obtains logical values of the data signal when the threshold values and the phase differences are set.

12. A test apparatus for testing a device under test, comprising:
    the receiving apparatus according to claim 1; and
    a judging section that judges pass or fail of the device under test based on a result of the acquired data signal received by the receiving apparatus.

13. A receiving method for a data signal and a clock signal indicating a reference timing to acquire the data signal, the receiving method comprising:

generating a first recovered clock of the clock signal;

generating a plurality of first strobes having different phases, in response to a pulse of the first recovered clock;

detecting a position of an edge of the clock signal relative to the first strobes based on values of the clock signal that are acquired at respective timings of the first strobes;

adjusting a phase of the first recovered clock by a phase adjustment amount, according to the position of the edge of the clock signal;

generating a second recovered clock;

generating, in response to a pulse of the second recovered clock, a plurality of second strobes having different phases;

detecting a position of an edge of the data signal relative to the second strobes, based on values of the data signal that are acquired at respective timings of the second strobes; and adjusting a phase of the second recovered clock according to the phase adjustment amount of the first recovered clock made in adjusting the phase of the first recovered clock.

14. A test method for a device under test, comprising:

judging pass or fail of the device under test based on a result of the acquired data signal received by the receiving method according to claim 13.

* * * * *